United States Patent [19]
Bierman et al.

[11] Patent Number: 6,035,100
[45] Date of Patent: Mar. 7, 2000

[54] REFLECTOR COVER FOR A SEMICONDUCTOR PROCESSING CHAMBER

[75] Inventors: Benjamin Bierman, Milpitas; David S. Ballance, Cupertino; James V. Tietz, Fremont; Brian Haas, San Jose; Meredith J. Williams, Santa Clara; Paul Deaton, San Jose, all of Calif.

[73] Assignee: Applied Materials, Inc., Santa Clara, Calif.

[21] Appl. No.: 08/858,089

[22] Filed: May 16, 1997

[51] Int. Cl.[7] .......................... H01L 21/26; H01L 21/324; F27B 5/08; F27B 5/14
[52] U.S. Cl. .......................... 392/416; 392/422; 219/390; 219/405; 118/725; 118/50.1; 250/492.22
[58] Field of Search ..................................... 392/416, 418, 392/422, 424, 430; 219/390, 405, 411; 118/725, 728, 50.1; 250/495.1, 496.1, 498.1, 503.1, 492.2, 504 R

[56] References Cited

U.S. PATENT DOCUMENTS

| | | | |
|---|---|---|---|
| 4,550,245 | 10/1985 | Arai et al. | 219/405 |
| 5,062,386 | 11/1991 | Christensen | 118/725 |
| 5,155,336 | 10/1992 | Gronet et al. | 219/411 |
| 5,264,038 | 11/1993 | Hara et al. | 118/725 |
| 5,399,523 | 3/1995 | Kakoschke | 438/795 |
| 5,660,472 | 8/1997 | Peuse et al. | 374/128 |

FOREIGN PATENT DOCUMENTS 4306398  9/1994  Germany.

*Primary Examiner*—Joseph Pelham
*Attorney, Agent, or Firm*—Fish & Richardson

[57] ABSTRACT

In one embodiment, the invention is directed to an apparatus for preventing depositions from occurring on a reflector in a processing chamber, comprising: a cover disposed adjacent to the reflector, the cover optically transparent over a range of wavelengths in which the reflector is reflective; and at least one cover support for maintaining the position of the cover relative to the reflector.

22 Claims, 3 Drawing Sheets

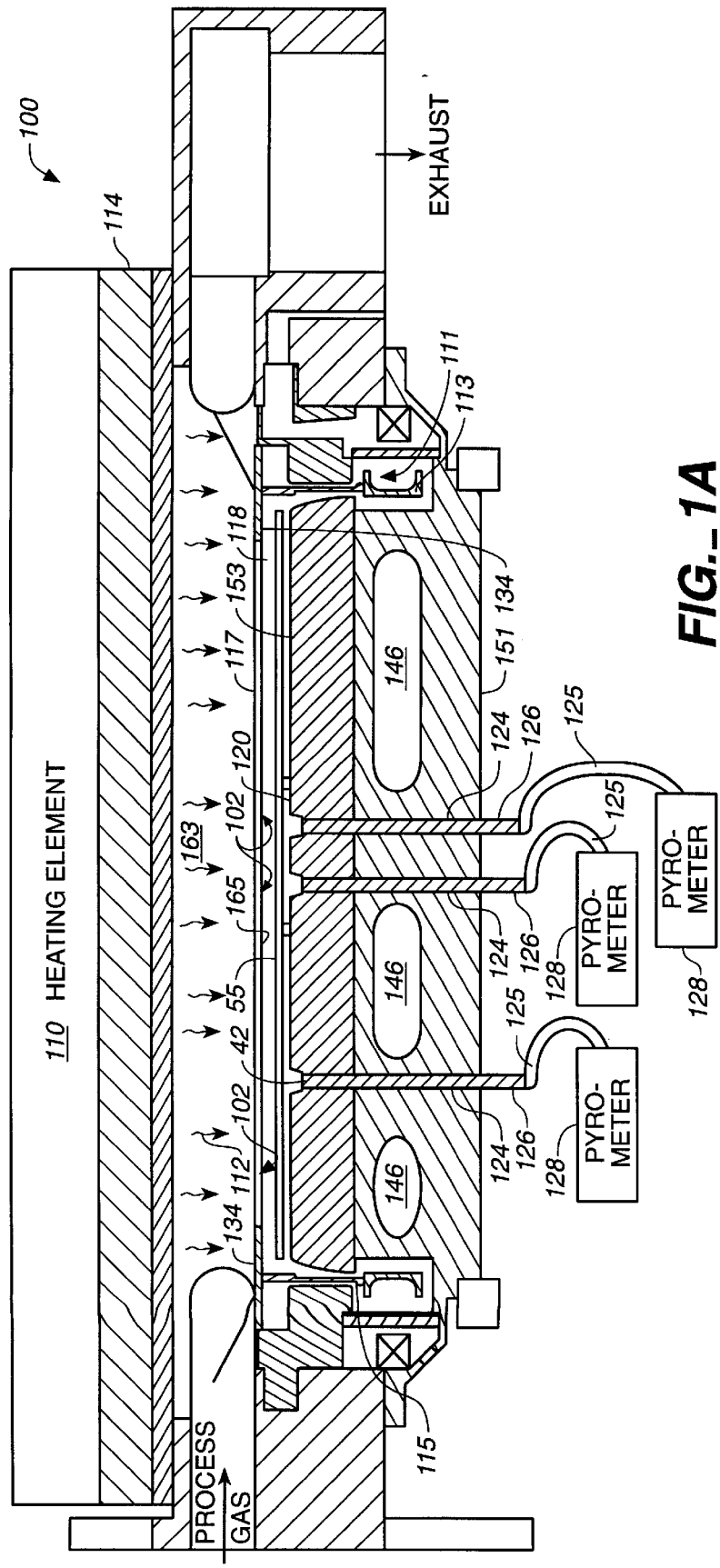
FIG._1A

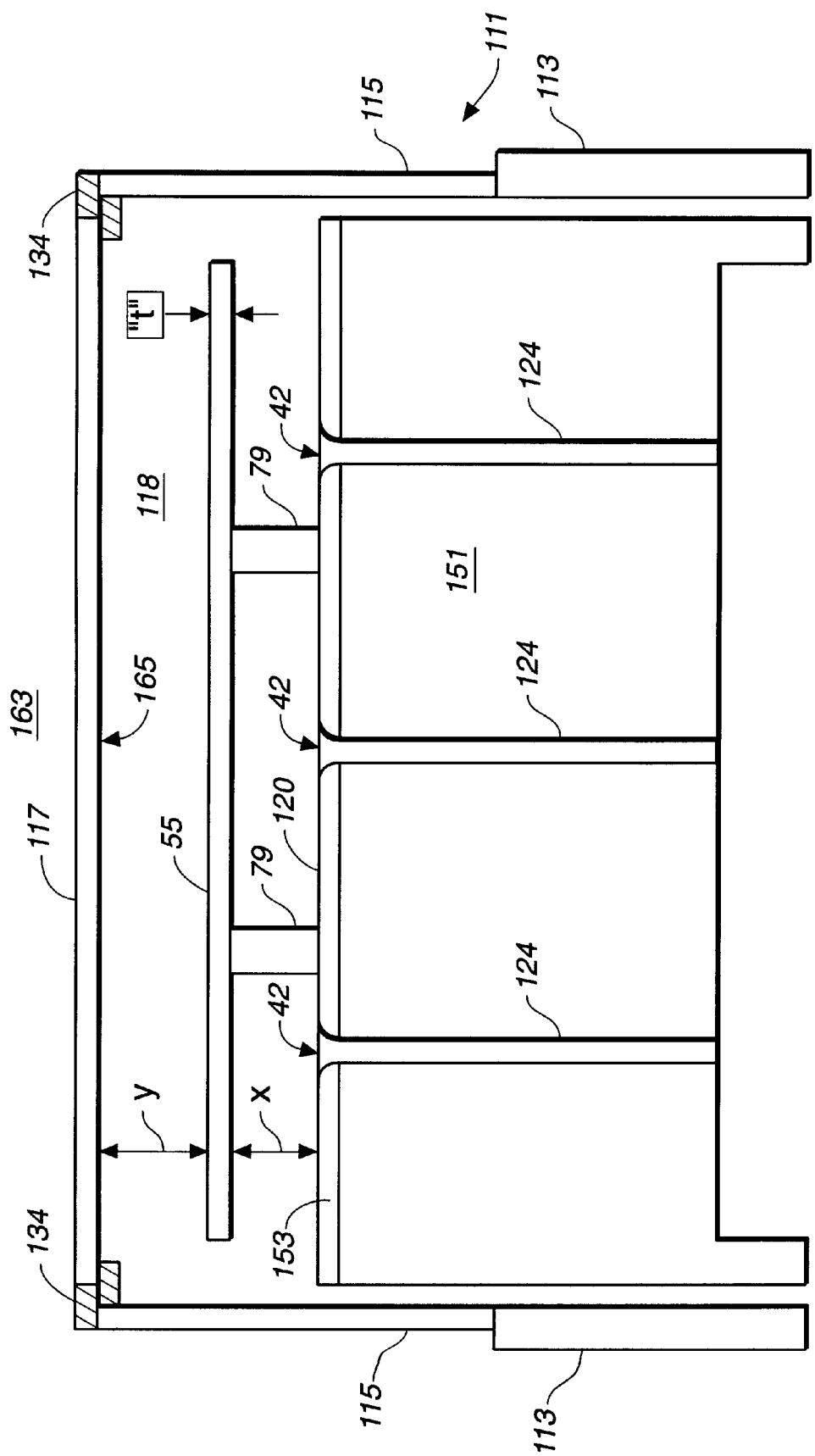
FIG._1B

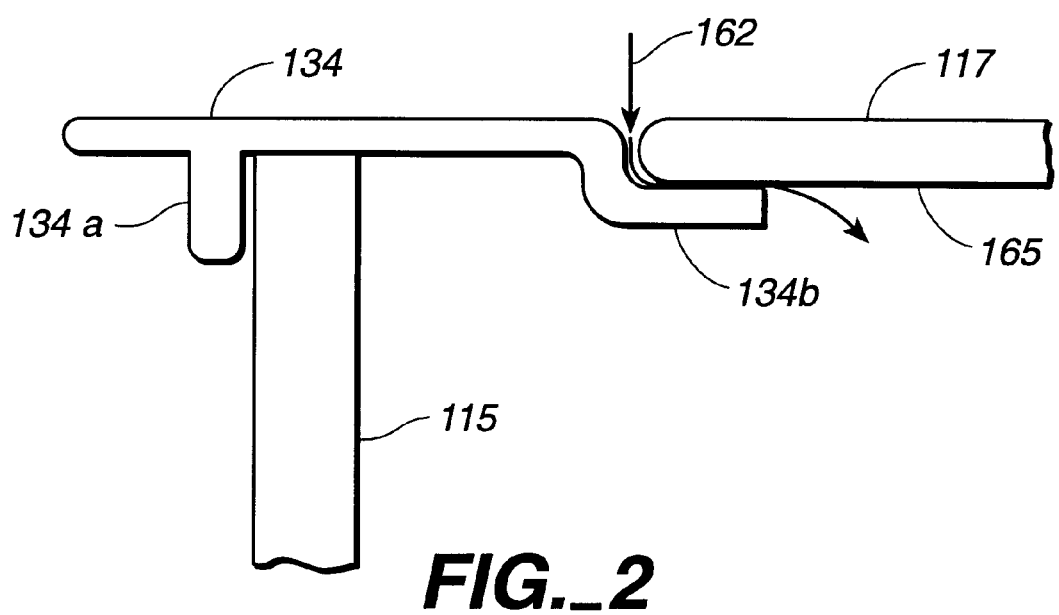
FIG._2

REFLECTOR COVER FOR A SEMICONDUCTOR PROCESSING CHAMBER

FIELD OF THE INVENTION

The present invention relates to rapid thermal processing (RTP) chambers employing reflecting cavities for temperature measurements, and more particularly to a cover which may be used in such a reflecting cavity to substantially inhibit deposition on a reflecting surface of the reflecting cavity.

BACKGROUND OF THE INVENTION

RTP technologies have developed to increase manufacturing throughput of semiconductor wafers while minimizing their handling. The types of wafers referred to here include those for ultra-large scale integrated circuits. RTP refers to several different processes, including rapid thermal annealing (RTA), rapid thermal cleaning (RTC), rapid thermal chemical vapor deposition (RTCVD), rapid thermal oxidation (RTO), and rapid thermal nitridation (RTN). For example, in the particular application of complementary metal-oxide-semiconductor (CMOS) gate dielectric formation by RTO or RTN, thickness, growth temperature, and uniformity of the gate dielectrics are critical parameters that influence the overall device performance and fabrication yield. Currently, CMOS devices are being made with dielectric layers that are only 60–80 angstroms (Å) thick and for which uniformity must be held within a few percent. This level of uniformity requires that temperature variations across the substrate during high temperature processing cannot exceed a few degrees Celsius (°C.).

The wafer itself often cannot tolerate even small temperature differentials during high temperature processing. If the temperature difference is allowed to rise above 1–2° C./cm at 1200° C., the resulting stress is likely to cause slip in the silicon crystal. The resulting slip planes will destroy any devices through which they pass. To achieve that level of temperature uniformity, reliable real-time, multi-point temperature measurements for closed-loop temperature control are necessary.

Optical pyrometry is being widely used for measuring temperatures in RTP systems. Pyrometry exploits a general property of objects, namely, that objects emit radiation with a particular spectral content and intensity that is characteristic of their temperature. Thus, by measuring the emitted radiation, the object's temperature can be determined.

A pyrometer measures the emitted radiation intensity and performs the appropriate conversion to obtain temperature (T). The relationship between spectral emitted intensity and temperature depends on the spectral emissivity of the substrate and the ideal blackbody radiation-temperature relationship, given by Planck's law:

$$I_b(\lambda, T) = \frac{2C_1}{\lambda^5 \left(e^{\frac{C_2}{\lambda T}} - 1\right)} \quad (1)$$

where $C_1$ and $C_2$ are known constants, $\lambda$ is the radiation wavelength of interest, and T is the substrate temperature measured in Kelvins. According to an approximation known as Wein's distribution law, this expression can be rewritten as follows:

$$I_b(\lambda, T) \approx K(\lambda) \cdot e^{-\frac{C_2}{\lambda T}} \quad (2)$$

where $K(\lambda) = 2C_1/\lambda_5$. This is a good approximation for temperatures below about 2700° C.

The spectral emissivity $\epsilon(\lambda, T)$ of an object is the ratio of its emitted spectral intensity $I(\lambda, T)$ to that of a blackbody at the same temperature $I_b(\lambda, T)$. That is, $$\epsilon = \frac{I(\lambda, T)}{I_b(\lambda, T)} \quad (3)$$

Since $C_1$ and $C_2$ are known constants, under ideal conditions, the temperature of the wafer can be accurately determined if $\epsilon(\lambda, T)$ is known.

However, despite its widespread use in the semiconductor industry, optical pyrometry still suffers from limitations due to an inability to accurately measure the emissivity of the substrate. Moreover, even if the emissivity of the substrate is known at a given temperature, it changes with temperature. The changes are usually not accurately measurable, and thus they introduce an unknown error into the temperature measurements. Errors on the order of 10° C. or more are not uncommon.

The spectral emissivity of a substrate depends on many factors, including the characteristics of the wafer itself (e.g. temperature, surface roughness, doping level of various impurities, material composition and thickness of surface layers), the characteristics of the process chamber, and the process history of the wafer. Therefore, a priori estimation of substrate emissivity cannot provide a general purpose pyrometric temperature measurement capability.

Techniques for reducing the effect of changes in wafer emissivity on temperature measurements are known. Some techniques are disclosed in U.S. patent applications Ser. Nos. 08/359,302, entitled "A Method and Apparatus for Measuring Substrate Temperatures", to Peuse et al., filed Dec. 19, 1994, and 08/641,477, entitled "A Method and Apparatus for Measuring Substrate Temperatures", to Peuse et al., filed May 1, 1996, both of which are assigned to the assignee of the present invention and incorporated herein by reference. One such technique involves placing a thermal reflector near the back surface of a target substrate to form a reflecting cavity which causes thermal radiation from the substrate to be reflected back to the substrate. A light pipe, which is inserted through the reflector into the cavity, samples radiation from the reflecting cavity and delivers the sampled light to a pyrometer. Assuming an ideal reflector, it can be shown mathematically that because all of the thermal radiation emitted from the substrate is reflected back onto the substrate, the reflecting cavity acts like an ideal black body. That is, the intensity of the thermal radiation within the reflecting cavity will not be a function of the emissivity of the surface of the substrate. Stated differently, in the ideal case the reflecting cavity increases the effective emissivity of the substrate to a value equal to one. However, because the reflector will be less than perfect, the effective emissivity of the substrate will be higher than the emissivity of the wafer but less than one.

One instance in which a reflector degrades to less-than-perfect reflectivity arises during chemical vapor deposition (CVD). In CVD, chemically reacting species may deposit on the reflector surfaces surrounding the pyrometers and, perhaps even more problematically, on the pyrometers themselves.

In particular, gaseous products of the chemical reactions on the wafer are expected to be exhausted. However, some amount of these gases may undesirably flow to regions below the plane of the wafer. For example, a typical silicon deposition may occur by the reaction of trichlorosilane (TCS) and molecular hydrogen ($H_2$) in a processing region above the wafer. Occasionally, some of the process gases may leak to the region below the wafer due to imperfections in the edge ring supporting the wafer or due to incomplete coverage of the edge ring by the wafer.

The leaked gases are approximately bounded in a cylindrical region which spans the distance between the wafer and the reflector. This distance is variable. The temperature of the top boundary of this region (the wafer) is typically about 1100° C. The temperature of the bottom boundary of this region (the reflector surface) may be water-cooled and at a temperature of between 50° C. and 200° C. such as about 150° C. Under these conditions and this thermal gradient, it is often noted that trapped TCS gas is converted to silicon chloride ($SiCl_2$) and hydrogen chloride (HCl) gases. These gases tend to form undesirable deposits on the reflector surface due to condensation. Undesirable deposits also occur on the backside of the wafer. Besides the reflector, other regions which may be so affected include the region directly below the wafer (within a well which typically contains a rotation mechanism) as well as the region surrounding the rotation mechanism. Damage and corrosion may be caused by the presence of hot gases in these regions.

One way of eliminating undesirable deposits is by use of a purge gas below the wafer. Such a purge gas may be used to direct undesired gases away from the reflector and the wafer backside. Such a system is described in U.S. Patent Application entitled "Method and Apparatus for Purging the Back Side of a Substrate During Chemical Vapor Processing", to Deaton, et al., filed on even date herewith, assigned to the assignee of the present invention and incorporated herein by reference.

Such systems do not specifically address the thermal gradient that occurs between the substrate and the reflector. Thus, it would be useful to provide a system which also reduces the effect of this thermal gradient.

SUMMARY OF THE INVENTION

The invention addresses at least the problem of deposition which may occur on the surface of a reflecting cavity due to thermal gradients between the surfaces of the cavity. The invention includes a cover over at least one surface of the reflecting cavity. This cover is optically transparent to the wavelength of radiation used by a number of pyrometers in measuring the temperature of a surface of the reflecting cavity. The cover may be kept at a thermal equilibrium such that a minimum of deposition occurs on the cover.

In one embodiment, the invention is directed to an apparatus for preventing depositions from occurring on a reflector in a processing chamber, comprising: a cover disposed adjacent to the reflector, the cover optically transparent over a range of wavelengths in which the reflector is reflective; and at least one cover support for maintaining the position of the cover relative to the reflector.

In another embodiment, the invention is directed to an apparatus for preventing depositions from occurring on a reflector in a processing chamber, comprising: a cover disposed adjacent, to but spaced apart from, the reflector, the cover optically transparent over a range of wavelengths in which the reflector is reflective; at least one cover support for maintaining the position of the cover relative to the reflector; and means for heating the cover.

Implementations of the invention may include one or more of the following. The invention may further comprise means for moving the cover relative to the heating means. The cover may be made of quartz. The cover may be separated from the heating means and the reflector by a predetermined distance such that the temperature of the cover is in a range of between about 350° C. and about 700° C., and more particularly in a range of between about 450° C. and about 550° C. The heating means may include a heated substrate or a plurality of infrared heating sources.

In another embodiment, the invention is directed to an apparatus for preventing depositions from occurring on a reflector in a processing chamber, comprising: a cover disposed between the reflector and a processing position of a substrate in the processing chamber, the cover optically transparent over a range of wavelengths in which the reflector is reflective; at least one cover support for maintaining the position of the cover relative to the reflector; and an infrared heating source disposed a predetermined distance from the substrate on the side of the substrate opposite the cover and reflector, to heat the substrate.

In another embodiment, the invention is directed towards n apparatus for preventing depositions from occurring on a portion of a semiconductor processing chamber, comprising: a reflector inside the processing chamber; a cover disposed between the reflector and a processing position of a substrate, the cover optically transparent over a range of wavelengths in which the reflector is reflective; at least one cover support to maintain the position of the cover relative to the reflector; and a heating source disposed a predetermined distance from the substrate on the side of the substrate opposite the cover and reflector, to heat the substrate.

Among the advantages of the invention are the following. The reflector is protected from deposition. Furthermore, other components of the RTP chamber are also protected. Such protection occurs without affecting the optical efficiency of the pyrometers. Deposition is discouraged from occurring on the reflector cover apparatus itself, and the reflector cover apparatus may be easily cleaned by wet or dry etching. The temperature and location of the reflector cover apparatus is adjustable according to the process requirements.

Additional features and advantages of the invention will be set forth in the description which follows.

BRIEF DESCRIPTION OF THE DRAWINGS

The accompanying drawings, which are incorporated in and constitute a part of the specification, schematically illustrate the invention and, together with the general description given above and the detailed description given below, serve to explain the principles of the invention.

FIG. 1A is a cross-sectional view of a portion of an RTP chamber according to the present invention having a cover located between a substrate and a reflector.

FIG. 1B is an enlarged view of the RTP chamber detailing the cover, this view of FIG. 1A having certain details omitted for clarity.

FIG. 2 shows details of a support ring for use in the RTP chamber according to an embodiment of the present invention.

DETAILED DESCRIPTION

Some types of RTP chambers that may be used with the present invention are disclosed in the following U.S. Patent Applications entitled: "A Method and Apparatus for Achieving Temperature Uniformity of a Substrate in an RTP Chamber" to David S. Ballance, et al.; "Magnetically- Levitated Rotor System for an RTP Chamber" to Benjamin Bierman and James V. Tietz; and "Co-Rotating Edge Ring Extension for use in a Semiconductor Processing Chamber" to David S. Ballance, et al. These are all assigned to the assignee of the present invention, filed on even date herewith, and incorporated herein by reference.

The term "substrate" broadly covers any object that is being processed in a thermal processing chamber and the temperature of which is being measured during processing. The term "substrate" includes, for example, semiconductor wafers, flat panel displays, and glass plates or disks.

An RTP system in accordance with the present invention is shown in FIGS. 1A and 1B. The RTP system includes a processing chamber 100 for processing a disk-shaped, twelve-inch (300 millimeter (mm)) diameter silicon substrate 117. Substrate 117 is mounted inside the chamber on a substrate support structure 111 and is heated by a heating element 110 located directly above the substrate. Heating element 110 generates radiation 112 which enters processing chamber 100 through a water-cooled quartz window assembly 114 which is approximately 25 mm above the substrate.

A suitable heating element 110 is disclosed in U.S. Pat. No. 5,155,336, assigned to the assignee of the present invention and incorporated herein by reference. This heating element uses a number of light pipes to deliver highly collimated radiation from tungsten-halogen lamps to processing chamber 100. The lamps may be divided into a number of zones which are located in a radially symmetrical manner. The zones can be individually adjusted to allow the radiative heating of different areas of substrate 117 to be controlled.

Beneath substrate 117 is a reflector 153 which is mounted on a water-cooled, stainless steel base 151. Reflector 153 may be made of aluminum and may have a highly reflective surface coating 120. Surface coating 120 is typically made of gold and sometimes includes a stack of alternating dielectric materials. An underside 165 of substrate 117 and surface 120 of reflector 153 form a reflecting cavity 118 for enhancing the effective emissivity of the substrate.

The separation between substrate 117 and reflector 153 is variable. In processing systems that are designed for twelve-inch silicon wafers, the distance between substrate 117 and reflector 153 may be between about 3 mm and 20 mm, such as about 17 mm. The width-to-height ratio of cavity 118 may be larger than about 20:1. If the separation is made too large, the emissivity-enhancement effect that is attributable to the virtual blackbody cavity that is formed will decrease. On the other hand, if the separation is too small, e.g. less than about 3 mm, then the thermal conduction from substrate 117 to reflector 153, which may be water-cooled, will increase. This often imposes an unacceptably large thermal load on heated substrate 117. Since the main mechanism for heat loss to reflector 153 is conduction through the gas, the thermal loading will depend on the type of gas and the chamber pressure during processing.

As shown in Figs. 1A, 1B and 2, support structure 111 which rotates the substrate includes a support ring 134 which contacts substrate 117 around the substrate's outer perimeter, thereby leaving all of underside 165 of substrate 117 exposed except for a small annular region about the outer perimeter. Support ring 134 may have a radial width of approximately 0.75 inch. To minimize the thermal discontinuities that will occur at the edge of substrate 117 during processing, support ring 134 is made of the same, or similar, material as substrate 117, e.g. silicon or silicon carbide.

Support ring 134 rests on a rotatable tubular quartz cylinder 115 that may be coated with silicon to render it opaque in the frequency range of a number of pyrometers 128, described below. The silicon coating on quartz cylinder 115 acts as a baffle to block out radiation from external sources that might contaminate the intensity measurements. The bottom of quartz cylinder 115 is held by a rotor 113 which is driven magnetically. For example, substrate 117 can be rotated by use of an annular upper bearing race (not shown) which rests on a plurality of ball bearings that are, in turn, held within an stationary, annular, lower bearing race. The ball bearings may be made of steel and coated with silicon nitride to reduce particulate formation during operation. The upper bearing race is magnetically-coupled to an actuator which rotates cylinder 115, support ring 134 and substrate 117 at an operating speed during thermal processing.

Referring specifically to FIG. 2, support ring 134 is designed to create a light tight seal with quartz cylinder 115. Extending from the bottom surface of support ring 134 is a cylindrically-shaped lip 134a which has an outside diameter that is slightly larger than the outside diameter of quartz cylinder 115 so that it fits over cylinder 115, as shown, and forms a light seal. On the inside region of support ring 134, there is a shelf 134b for supporting substrate 117. Shelf 134b is a region around the inside circumference of support ring 134 that is lower than the rest of support ring 134. Support ring 134 is subject to corrosion due to its proximity to a processing region 163 where reactive gases deposit material on the substrate.

Support ring 134 has an outer radius that is larger than the radius of quartz cylinder 115 so that it extends out beyond quartz cylinder 115. The annular extension of support ring 134 beyond cylinder 115, in cooperation with a purge ring located below it (not shown), functions as a baffle which prevents stray light from entering reflecting cavity 118 at the backside of substrate 117. To further reduce the possibility of stray light reflecting into reflecting cavity 118, support ring 134 may also be coated with a material that absorbs the radiation generated by heating element 110 (e.g., a black or grey material).

The temperatures at a number of localized regions 102 of substrate 117 are measured by a plurality of temperature probes (only three of which are shown in FIG. 1A). Each temperature probe includes a sapphire light pipe 126 that passes through a conduit 124 that extends from the backside of base 151 through the top of reflector 153. Sapphire light pipes 126 may be about 0.080 inch in diameter and conduits 124 are slightly larger to enable them to be easily inserted into the conduits.

In accordance with one aspect of the invention, a small reflective cavity 42 (i.e., a microcavity) is formed in the top surface of reflector 153 where each conduit 124 passes through to the top of reflector 153. A sapphire light pipe 126 is positioned within conduit 124 so that its uppermost end is flush with or slightly below the bottom of cavity 42. The other end of light pipe 126 couples to a flexible optical fiber 125 that transmits sampled light from cavity 42 to pyrometer 128.

To achieve a high reflectivity for reflector 153, a highly reflective multi-layered coating 120 as noted above is formed on top of reflector 153. The bottom layer of coating 120 may be thin layer of gold or aluminum which is deposited onto the surface of reflector 153. Gold is often used because it has a reflectivity of about 0.975 in the infrared wavelength range of interest (i.e., about 950 nm) but it may be undesirable for some semiconductor applications. To further enhance the reflectivity of the gold layer, a quarter-wave stack may be formed on top of the gold layer. The quarter-wave stack is made up of alternating dielectric layers which have different indices of refraction and have a thickness equal to one-quarter of the wavelength to which the pyrometer is most sensitive (e.g., one-quarter of 950 nm).

The top layer of the multi-layered structure may be a passivation layer, which prevents the gold of the reflecting layer from possibly contaminating the RTP chamber. The passivation layer may be made of silicon dioxide, aluminum oxide, silicon nitride, or any other acceptable materials that will passivate the reflecting layer without degrading its reflective properties at the wavelength of interest.

The reflectivity of this multi-layered structure may be about 0.995 at 950 nm, which is significantly higher than the natural reflectivity of 0.975 for a single thin gold film.

If gold is unacceptable, other reflecting materials may, of course, be used. For example, nickel is more inert than gold and has a good reflectivity, though not as high as gold.

Another reflector coating is disclosed in U.S. patent application Ser. No. 08/697,633, entitled "Reflector For A Semiconductor Processing Chamber", filed Aug. 28, 1996, assigned to the assignee of the present invention, and incorporated herein by reference.

As indicated above, although only three measurement probes are shown, the invention may actually use a number of measurement probes distributed over reflector 153 so as to measure the temperature at different radii of substrate 117. During thermal processing, support structure 111 is rotated at speeds equal to or greater than about 20 RPM. Thus, each probe actually samples the temperature profile of a corresponding annular ring area on the substrate.

In the embodiment of FIG. 1A, base 151 includes a circulation circuit 146 through which coolant circulates, thereby cooling the reflector and the reflecting surface. Water which is typically at about 23° C. is circulated through base 151 to keep the temperature of reflector 153 well below that of heated substrate 117 (e.g., 150° C. or less).

A cover 55 is disposed above reflector 153. Cover 55 is supported by a plurality of supports 79 which may connect to reflector 153 or to other parts of the chamber. As shown in FIG. 1B, supports 79 may be two cylindrical posts. Any number of supports may be used as required. Supports 79 may be replaced by numerous other types of coupling structures including rings, pins, suspensions, etc.

Cover 55 is preferably made of quartz. The use of quartz is particularly advantageous for its thermal, chemical and optical properties. Other materials may also be used, especially those whose thermal, chemical and optical properties are somewhat analogous to quartz.

Cover 55 is located a distance "x" above reflector 153 and a distance "y" below the bottom surface of substrate 117. In one embodiment, x may be between about 2–5 mm and y may be between about 10–15 mm. These distances are chosen in part to balance the thermal load on cover 55. The thickness "t" of the quartz cover may be between about 2–3 mm. Using values such as these, the temperature of cover 55 is maintained such that, for reasons described below, a minimum of deposition occurs on cover 55 or on reflector 153 below it. Cover 55 may extend over the entire surface of reflector 153 so that condensation does not occur around the edge of reflector 153.

As mentioned above, typical silicon deposition may occur by the reaction of TCS and $H_2$ in processing region 163 above substrate 117. Occasionally, some of the process gases may leak to the region below substrate 117. For example, gases may follow the path shown in FIG. 2 by arrow 162. Cover 55 effectively works to stop deposition on reflector 153 in at least two ways.

First, cover 55 acts as a physical barrier to gas particles transmitting from a point near substrate 117 down to reflector 153 along path 162. Second, the thermal properties of cover 55 allow it to act as a barrier to undesirable reactions. To act in such a manner, it is noted that cover 55 attains a temperature between that of hot substrate 117 and reflector 153 due to its location between them. If substrate 117 is at a processing temperature of 1100° C. and reflector surface 55 is at a temperature of 150° C., the temperature of cover 55 may range from between about 350° C. to about 700° C. depending on distances x and y. This range of temperatures may be varied by varying the temperature of substrate 117 (via the lamps), and the distances x and y. In general, as the ratio of x to y increases, the temperature of cover 55 increases. Conversely, as the ratio of x to y decreases, the temperature of cover 55 decreases. These dimensions are selected such that the temperature of cover 55 is high enough to discourage condensation of the leaked gases on the cover, but low enough to discourage reaction of the leaked gases with the chemical species present on the surface of the cover. Also, a properly controlled thermal gradient allows any intermediate reactions that may occur to progress to completion. In this way, reactants are maintained in the gas phase and not deposited. Of course, in a case where the thermal gradient is reduced, the amount of gas species deposited on cover 55 is reduced. Other variables affecting the temperature of cover 55 include its dimensions as they relate to thermal conduction and radiative heat transfer.

This range of cover temperatures is significant for another reason relating to the chemical properties of cover 55. For cover temperatures too far below 350° C., the undesirable $SiCl_2$ noted above is converted to a variety of similarly undesirable chlorosilane products. For temperatures too far above 700° C., the undesirable $SiCl_2$ noted above is converted to silicon metal. For temperatures in the specified range (e.g. from 350° C. to 700° C.), no deposition appears on cover 55 because the $SiCl_2$ deposits and simultaneously is etched by HCl molecules. Thus no net deposition occurs. It has further been found that an even more specific temperature range for this effect is from about 450° C. to about 550° C.

By so inhibiting deposition, cover 55 acts in a way complementary to that of the U.S. Patent Application incorporated by reference above for a "Method and Apparatus for Purging the Back Side of a Substrate During Chemical Vapor Processing." In that application, deposition on the reflector is inhibited by flowing a gas over the reflector. This technique may preferentially protect the area of the reflector near the purge gas entrance port into the cavity. It is noted that, while not necessary, both techniques may be used together to achieve superior results. In so doing, cover 55 tends to slow the transport of depositing species by reducing the thermal gradient, and the purge gas sweeps away the species so slowed.

Cleaning of cover 55 may be performed by moving cover 55 closer to substrate 117, to raise the cover temperature, and by flowing HCl gas into processing chamber 100 or even directly into cavity 118. Cover 55 may be moved closer to substrate 117 by using a plurality of lift pins (not shown) which emerge from reflector 153 and are controlled by a separate controller. By moving cover 55 closer to substrate 117 and introducing a cleaning gas into the chamber, etching of cover 55 occurs. The choice of cleaning gas and the distance that cover 55 must be moved are, in part, dependent on the material constituting cover 55 and the deposited material to be etched. In general, the temperature of cover 55 needs to be raised to at least 600° C. for cleaning to occur with HCl gas. Other types of cleaning gases which may be used includes nitrogen trifluoride ($NF_3$), chlorine trifluoride ($ClF_3$), perfluoroethane ($C_2F_6$), or other gases having similar cleaning properties. Cover 55 may also be periodically removed from the chamber and etched with a dilute HF solution to clean the same.

The optical properties of cover 55 are also important. Pyrometers 128 primarily operate in the near-infrared wavelengths. As mentioned above, hot substrate 117 radioactively heats cover 55 to temperatures which may range from about 350° C. to about 700° C. At these temperatures and beyond, quartz and analogous materials are effectively transparent to the near-infrared wavelengths. Thus, the pyrometer optical efficiency and operating parameters are not compromised.

The present invention has been described in terms of preferred embodiments. The invention, however, is not limited to the embodiment depicted and described. Rather, the scope of the invention is defined by the appended claims.

What is claimed is:

1. An apparatus for processing a substrate having a top surface to be processed and a bottom surface, comprising:
   a reflector positioned adjacent to the bottom surface of the substrate to define a reflecting cavity between the bottom surface of the substrate and the reflector;
   a cover disposed in the reflecting cavity, the cover being optically transparent over a range of wavelengths in which the reflector is reflective; and
   at least one cover support to maintain the cover at a position spaced-apart from the reflector wherein the cover support is adjustable to support the cover over a range of distances from the reflector.

2. A process chamber for processing a substrate having a top surface and a bottom surface, comprising:
   a reflector positioned adjacent to the bottom surface of the substrate to define a reflecting cavity on only one side of the substrate between the bottom surface of the substrate and the reflector, the reflecting cavity and the reflector causing thermal radiation from the substrate to be reflected back to the substrate during processing of the substrate;
   a cover disposed in the reflecting cavity adjacent to but spaced-apart from the reflector, the cover being optically transparent over a range of wavelengths in which the reflector is reflective;
   at least one cover support to maintain the cover at a position spaced apart from the reflector; and
   means for heating the substrate located on a side of the substrate opposite that of the reflector.

3. The apparatus of claim 2, further comprising means for moving said cover relative to said heating means.

4. The apparatus of claim 2, wherein said cover is made of quartz.

5. The apparatus of claim 2, wherein said cover is separated from the reflector by a predetermined distance.

6. The apparatus of claim 5, wherein the predetermined distance is selected to achieve a cover temperature in a range of between about 350° C. and about 700° C. while the substrate is being processed.

7. The apparatus of claim 5, wherein the predetermined distance is selected to achieve a cover temperature in a range of between about 450° C. and about 550° C. while the substrate is being processed.

8. The apparatus of claim 2, wherein said heating means includes a heated substrate.

9. The apparatus of claim 2, wherein said heating means includes a plurality of infrared heating sources.

10. A process chamber for processing a substrate having a top surface and a bottom surface, comprising:
    a reflector positioned adjacent to the bottom surface of the substrate to define a reflecting cavity between the bottom surface of the substrate and the reflector;
    a cover disposed in the reflecting cavity between the reflector and the bottom surface of the substrate, the cover being optically transparent over a range of wavelengths in which the reflector is reflective;
    at least one cover support to maintain the cover at a position spaced-apart from the reflector; and
    an infrared heating source disposed a predetermined distance from the substrate on the side of the substrate opposite the cover and the reflector, and configured to heat the substrate without directing radiation directly onto the reflector.

11. A process chamber for processing a substrate having a top surface to be processed and a bottom surface, comprising:
    a reflector positioned adjacent to the bottom surface of the substrate to define a reflecting cavity between the bottom surface of the substrate and the reflector;
    a cover disposed in the reflecting cavity between the reflector and the substrate, the cover being optically transparent over a range of wavelengths in which the reflector is reflective;
    at least one cover support to maintain the cover at a position spaced-apart from the reflector; and
    a radiant energy heating source disposed a predetermined distance from the substrate on the side of the substrate opposite the cover and the reflector, and configured to heat the substrate without directing radiation directly onto the reflector.

12. A method for processing a substrate having a top surface to be processed and a bottom surface, comprising:
    providing a rapid thermal processing chamber including:
       a reflector positioned adjacent to the bottom surface of the substrate to define a reflecting cavity between the bottom surface of the substrate and the reflector, and
       a heatable optically-transparent cover disposed in the reflecting cavity at a position spaced-apart from the reflector; and
    positioning the cover in the reflecting cavity so that the temperature of the cover is between about 350° C. and about 700° C. while the substrate is being processed.

13. A process chamber for processing a substrate having a top surface and a bottom surface, comprising:
    a reflector positioned to define, between the reflector and the bottom surface of the substrate, a reflecting cavity on only one side of the substrate, the reflecting cavity and the reflector causing thermal radiation emitted from the substrate to be reflected back to the substrate during processing;
    a cover disposed in the reflecting cavity at a position spaced-apart from the reflector, the cover being substantially transmissive to thermal radiation emitted by the substrate and reflected by the reflector; and
    a radiation energy source disposed on a side of the substrate opposite that of the reflector to heat the substrate.

14. The apparatus of claim 13, further comprising at least one cover support configured to support the cover a distance from the reflector.

15. The apparatus of claim 13, wherein the cover support is adjustable to support the cover over a range of distances from the reflector.

16. The apparatus of claim 13, wherein the cover is formed from quartz.

17. The apparatus of claim 13, wherein the cover is positioned a distance from the reflector selected to achieve a cover temperature in the range of about 350–700° C. while the substrate is being processed.

18. The apparatus of claim 13, wherein the cover is positioned a distance from the reflector selected to achieve a cover temperature in the range of about 450–550° C. while the substrate is being processed.

19. The apparatus of claim 13, wherein the reflector is positioned to reflect thermal radiation emitted by the bottom surface of the substrate.

20. The apparatus of claim 13, wherein the reflector defines an opening for receiving thermal radiation from the reflecting cavity; and further comprising:

an optical device coupled to the opening defined by the reflector and configured to provide an indication of the temperature of the substrate based on thermal radiation received through the opening.

21. A method for processing a substrate having a top surface to be processed and a bottom surface, comprising:

providing a rapid thermal processing chamber including:
a reflector positioned adjacent to the bottom surface of the substrate to define a reflecting cavity between the bottom surface of the substrate and the reflector, and
a heatable optically-transparent cover having a cover surface disposed in the reflecting cavity at a position spaced-apart from the reflector; and positioning the cover in the reflecting cavity so that during processing of the substrate the temperature at the cover surface is high enough to deter condensation of a gas on the cover surface but low enough to deter reaction of the gas with a chemical species on the cover surface.

22. The method of claim 21 wherein the cover is positioned so the temperature at the cover surface is between about 350° C. and 700° C.

* * * * *

UNITED STATES PATENT AND TRADEMARK OFFICE
CERTIFICATE OF CORRECTION

PATENT NO. : 6,035,100
DATED : March 7, 2000
INVENTOR(S) : Benjamin Bierman, et. al.

It is certified that error appears in the above-identified patent and that said Letters Patent is hereby corrected as shown below:

Title page, item [54] and col. 1, the title of the invention should read –APPARATUS AND METHODS FOR PROCESSING A SUBSTRATE WHILE REDUCING DEPOSITIONS ON A REFLECTOR--

Signed and Sealed this

Eighth Day of August, 2000

Attest:

Attesting Officer

Q. TODD DICKINSON
*Director of Patents and Trademarks*